United States Patent [19]

Kohara et al.

[11] Patent Number: 4,779,338
[45] Date of Patent: Oct. 25, 1988

[54] METHOD OF MOUNTING LSI

[75] Inventors: Ichirou Kohara; Kazuhito Ozawa, both of Nara, Japan

[73] Assignee: Sharp Kabushiki Kaisha, Osaka, Japan

[21] Appl. No.: 5,939

[22] Filed: Jan. 22, 1987

[30] Foreign Application Priority Data

Jan. 22, 1986 [JP] Japan .................................. 61-12709

[51] Int. Cl.⁴ .............................................. H05K 3/32
[52] U.S. Cl. ........................................ 29/832; 29/840; 361/403; 357/66
[58] Field of Search .................. 29/832, 840; 361/803, 361/418; 357/66, 80

[56] References Cited

U.S. PATENT DOCUMENTS 4,381,602  5/1983  McIver .................................. 29/840
4,631,820 12/1986  Harada et al. ........................ 29/840

Primary Examiner—Howard N. Goldberg
Assistant Examiner—Taylor J. Ross
Attorney, Agent, or Firm—Birch, Stewart, Kolasch & Birch

[57] ABSTRACT

A method of mounting an LSI or IC on a wiring circuit substrate by hot-pressing which comprises the steps of placing the pins of the LSI or IC on a heat sealant printed over the circuit pattern of the substrate, placing a film sheet on the entire or partial surface of the LSI chip or IC chip including the pins of the chip, and carrying out a hot-pressing operation on the film sheet.

2 Claims, 2 Drawing Sheets

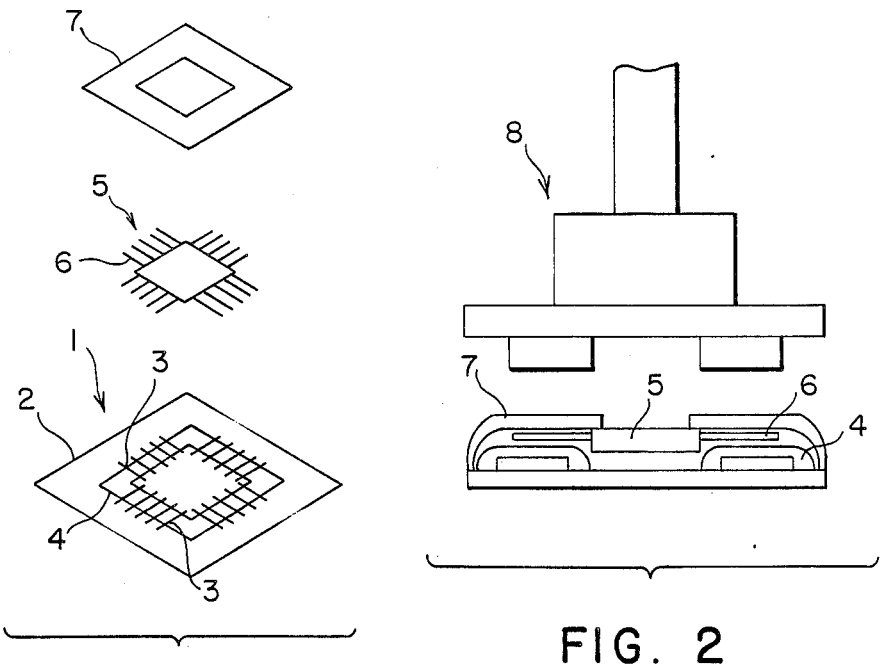
FIG. 2
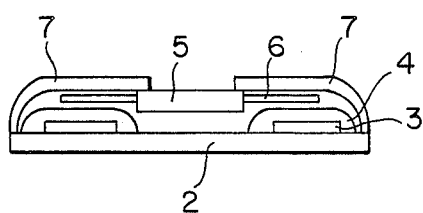
FIG. 1
FIG. 3

METHOD OF MOUNTING LSI

BACKGROUND OF THE INVENTION

The present invention relates to a method for mounting an LSI (large scale integrated circuit) on a wiring circuit substrate by hot pressing.

The conventional method for mounting an LSI chip on a wiring circuit substrate such as a film circuit substrate or printed circuit substrate, as shown in FIG. 5, comprises the step of placing the pins of the LSI chip "b" on the wiring circuit substrate "a" with a circuit pattern formed thereon, the step of covering the pins with a film sheet "d" coated with heat sealant "c", and the step of hotpressing the film sheet "d". Another conventional method is to bond the pins of the LSI chip "b" onto the wiring circuit substrate "a" with resin "e", as shown in FIG. 6.

The former method has the following defects: when hot-pressed, the heat sealant "c" on the film sheet "d" flows in the joint between the LSI chip "b" and the circuit pattern on the substrate "a", possibly impairing the insulation property. Besides, this method incurrs high material cost because it uses the film sheet "d" coated with heat sealant "c". The latter method is also defective in that it takes a long time for the resin "e" to cure and for the resin covers wide range of area, hampering high density mounting.

SUMMARY OF THE INVENTION

The object of the present invention is to provide an LSI-mounting method in which heat sealant and LSI chip pins placed on the circuit pattern of a wiring circuit substrate are hot-pressed through a film sheet covering the heat sealant and the pins, thus achieving reduction in material cost and operation time.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above object, in mounting an LSI chip on a wiring circuit substrate by hot-pressing, the method of the present invention comprises the steps of placing the LSI chip pins on the heat sealant printed over the circuit pattern on the substrate, a step of placing a film sheet over the entire or partial surface of the LSI chip including the pins, and a step of carrying out hot-pressing operation over the film sheet.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 1 is a perspective view of an embodiment of the present invention;

FIG. 2 is a section viewed from the front of the embodiment of the present invention;

FIG. 3 is a section of an application of the present invention;

DESCRIPTION OF THE INVENTION

Figure 4:
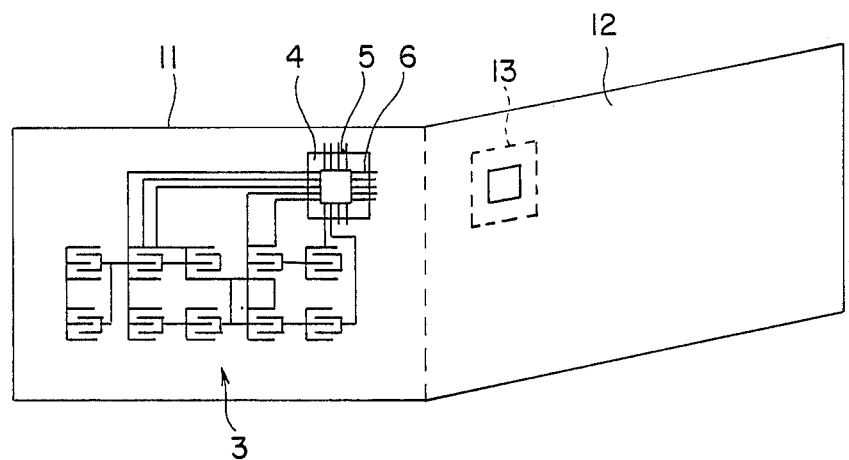
FIG. 4 shows another application of the invention.
Figure 5:
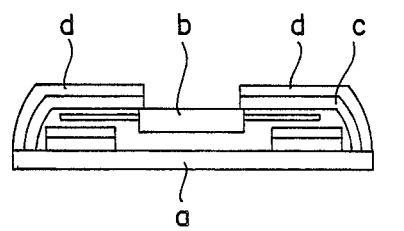
FIGS. 5 and 6 are sectional views of the conventional devices.
Figure 6:
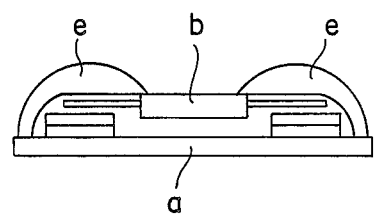

FIG. 1 explains the LSI (large scale integrated circuit)-mounting method of one embodiment of the present invention. A wiring circuit substrate 1 comprises a circuit pattern 3 of carbon paste printed on a polyester film 2, and heat sealant 4 of anisotropic conductive paste printed in a specified pattern covering the circuit pattern 3. The LSI-mounting method of the present invention comprises the steps of putting an LSI chip 5 on the wiring circuit substrate 1 so that the pins 6 of the chip 5 are in a specified position on the heat sealant 4, placing a film sheet 7 made of polyester film over the LSI chip 5 including the pins 6 on the substrate 1, and carrying out a heat-pressing operation on the film sheet 7 by a hot press 8 shown in FIG. 2, whereby connection of the pins 6 of the LSI chip 5 to the wiring circuit substrate 1 is achieved simultaneously as the LSI chip 5 is packed by the film sheet 7. The film sheet net only protects the joint between the LSI chip pins 6 and the wiring circuit substrate 1, but 7 also prevents the heat sealant 4 from sticking to the silicon head of the hot press 8 in the heat-pressing operation.

FIG. 3 is a sectional view of the LSI chip mounted on the wiring circuit substrate using the above method. The film sheet 7 has an opening, and covers only the peripheral edge of the LSI chip 5 and the pins 6.

The film sheet may be placed over the entire surface of the LSI chip including the pins before heat-pressing.

FIG. 4 shows another embodiment of the present invention in which a film circuit substrate is folded double for use as a key circuit. In this example, the substrate is folded to make the film circuit substrate 12 overlie the substrate 11 on which the LSI chip 5 is to be mounted, so that the portion with no printed circuit pattern on the substrate 12 is utilized for packing the LSI chip 5. Specifically, the substrate 12 is laid over the substrate 11 by folding, so that the portion 13 of the substrate 12 overlaps the heat sealant 4 and the LSI chip pins 6 on the substrate 11. In this state, hot-pressing is conducted over the portion 13 of the film circuit substrate 12, which enhances operationability and saves material cost.

The LSI of the present invention may include IC (integrated circuits).

According to the present invention, as understood from the above, the heat sealant and the LSI chip pins on the circuit pattern of the wiring circuit substrate are covered with a film sheet and hot-pressed through the film sheet, so that material cost and operational time are reduced. Moreover, since the method of the present invention prevents the heat sealant from flowing during the hot pressing operation, it is suitable for high density mounting.

While only certain embodiment of the present invention have been described, it will be apparent to those skilled in the art that various changes and modifications may be made therein without departing from the spirit and scope of the present invention as claimed.

What is claimed is:

1. A method of a mounting a LSI or an IC on a wiring circuit substrate by hot-pressing which comprises the steps of:
   placing the pins of said LSI or IC on a heat sealant printed over the circuit pattern of said substrate;
   placing a film sheet on the entire or partial surface of said LSI or IC chip, including said pins; and
   carrying out a hot-pressing operation on the film sheet.

2. The method of mounting a LSI or an IC on a wiring circuit substrate by hot-pressing according to claim 1, wherein the heat sealant is an anisotropic conductive paste.

* * * * *